United States Patent [19]

Berger et al.

[11] 4,035,664
[45] July 12, 1977

[54] CURRENT HOGGING INJECTION LOGIC

[75] Inventors: Horst H. Berger, Sindelfingen; Siegfried K. Wiedmann, Stuttgart, both of Germany

[73] Assignee: International Business Machines Corporation, Armonk, N.Y.

[21] Appl. No.: 613,658

[22] Filed: Sept. 15, 1975

[30] Foreign Application Priority Data

Mar. 5, 1975 Germany .......................... 2509530

[51] Int. Cl.² ................ H01L 27/04; H03K 19/08; H03K 19/36
[52] U.S. Cl. ............................ 307/215; 307/213; 357/15; 357/35; 357/36; 357/44; 357/46
[58] Field of Search ................. 357/15, 35, 36, 44, 357/46; 307/215

[56] References Cited

U.S. PATENT DOCUMENTS

| 3,823,353 | 7/1974 | Berger et al. | 357/46 |
| 3,829,718 | 8/1974 | Hart | 357/46 |

FOREIGN PATENT DOCUMENTS

| 2,224,574 | 11/1972 | Germany | 357/44 |
| 2,262,297 | 6/1974 | Germany | 357/44 |
| 7,107,040 | 11/1972 | Netherlands | 357/44 |
| 1,398,862 | 6/1975 | United Kingdom | 357/44 |

OTHER PUBLICATIONS

Müller, "Current Hogging Injection Logic", IEEE Int. Solid–State Circts. Conf., Dig. Tech. Papers, Feb. 1975, pp. 174–175.
Lehning, "Current Hogging Logic...," IEE J. Solid-State Circuits, vol. SC–9, p. 228–233, Oct. 1974.

*Primary Examiner*—William D. Larkins
*Attorney, Agent, or Firm*—Wesley DeBruin

[57] ABSTRACT

The disclosure is directed to the circuitry and monolithic semiconductor structure of Current Hogging Injection Logic Configurations. More specifically the disclosure relates to a semiconductor arrangement for the basic components of a highly integratable, logic semiconductor circuit concept predicated on multicollector inverter transistors which are fed by means of a carrier injection into their emitter/base zones.

25 Claims, 31 Drawing Figures

SYMBOLS USED

OHMIC CONTACT

SCHOTTKY - CONTACT (LOW BARRIER)

SCHOTTKY - CONTACT (HIGH BARRIER)

P - TYPE MATERIAL

N - TYPE MATERIAL

SCHOTTKY - COLLECTOR TRANSISTOR

I    INJECTOR TERMINAL
E    INPUT
A    OUTPUT

CURRENT HOGGING INJECTION LOGIC

BACKGROUND OF THE INVENTION AND PRIOR ART

Extensive development effort has been made and is being made in the field of logic circuitry employing bipolar transistors. In the art, a development that has encountered great interest is I²L (Integrated Injection Logic). It has been widely discussed in technical literature, cp. e.g. the articles in the IEEE Journal of Solid-State Circuits, (1) "Merged-Transistor Logic (MTL) - A Low-Cost Bipolar Logic Concept," Vol. SC-7, No. 5, October 1972, pages 340 through 346 by Horst H. Berger and Siegfried K. Wiedmann, and (2) "Integrated Injection Logic: A New Approach to LSI," Vol. SC-7, No. 5, October 1972, pages 346 through 351 by Kees Hart and Arie Slob. Patent literature references are, for example, U.S. Pat. Nos. 3,736,477 and 3,816,758. The injection logic concept is based substantially on multi-collector transistors for negation (inverter transistors) which are fed by direct injection, i.e. injection taking place inside the semiconductor body, of minority carriers into the vicinity (in the order of one diffusion length) of their emitter/base junctions.

This bipolar logic concept offers short switching times as well as an excellent applicability for the structuring of large scale integrated circuits with a large number of logic gates that can be made on one single semiconductor chip. For the manufacture of logic circuits in highly integrated technology such circuits have to meet three main conditions. The basic elements have to be as simple and space-saving as possible so that as many as possible can be provided on one semiconductor chip. Secondly, the circuits have to be designed in such a manner that a sufficient speed does not cause an excessive rise of the power dissipation on the semiconductor chip. This equals the demand for a minimum product of the factors delay time and power dissipation per logic function. Thirdly, the necessary manufacturing process has to be simple and easily realizable for obtaining a high yield. All these points of view are considered by the above mentioned logic concept in principle, and in particular as compared with the existing logic concepts (e.g. TTL logic).

It is furthermore known from the publication in the IBM Technical Disclosure Bulletin Publication entitled "Integrated, Separately Switchable Current Sources" by H. H. Berger, Vol. 14, No. 5, October 1971, pp. 1422, 1423 and GE-OS 20 27 127 that in a lateral NPN zone sequence the injection current coming from a primary injector can be switched via a secondary injector in the path of the injection current. However, a complex logic system cannot yet be realized in that manner owing to the lack of an inverter function. There furthermore exists a publication in IEEE Solid-State Circuits Conference 1974, Digest of Technical Papers, 18/19 which describes how the logic AND and OR combinations are to be realized. The inversion required for each logic system, however, is achieved in NPN transistors. This system has the disadvantage that the (logically acting) secondary injection structures have to be isolated from the (inverting) NPN transistors. Additionally these NPN transistors have to be isolated from each other. Furthermore, the decoupling of the inputs of various injection structures, which are to be controlled by the same input signal, requires a considerable amount of decoupling.

It is the primary object of the present invention to improve the above mentioned injection logic concept to achieve an increased logic efficiency. Considering the continuous demand for a maximum simplicity of the basic structures provision is made for further logic functions. Also less complicated realization of former logic functions is accomplished. Other existing restrictions of the prior art are removed, or at least mitigated. Significantly, such as the limited number of existing decoupled outputs of the prior art is obviated. It should especially be appreciated that complex logic networks structured from the basic logic gates require in general a high degree of problematic conductive line connections. Finally, a maximum of flexibility regarding utilization for a great variety of logic networks is presented.

The invention provides a semiconductor arrangement substantially predicated on the principle of current feeding by means of direct injection, where through condition-dependent switching of the injection current on its path toward the respective output-side inverter transistor, additional input or also output means are available. Thus, otherwise necessary conductive line connections on the semiconductor body are replaced to a high degree by internal controllable injection couplings. Contrary to circuits of a different type, the availability of a maximum number of decoupled inputs and outputs - also for partial logic functions - is of particularly high importance for the required system designs in logic circuits. It is furthermore highly desirable that from such a circuit output another input can always be driven again, without signal conversion. These criteria are satisfied in the arrangement in accordance with the invention.

The foregoing and other objects and features of the invention will be more apparent from the following more particular description of the preferred embodiments of the invention, as illustrated in the accompanying drawings.

Below, the invention and the preferred embodiments in accordance with the invention will be described in detail by means of the drawings.

BRIEF DESCRIPTION OF THE DRAWINGS

FIGS. 2A, 2B and 2C depict structure and circuitry of basic MTL components and on which the invention is predicated and employed therein.

FIGS. 3A, 3B and 3C depict a first preferred embodiment of the invention employing I²L concepts.

FIGS. 4, 5A, 5B, 5C, 6, 7A, 7B and 7C disclose further preferred embodiments of the invention with logic extensions with respect to the possible logic functions obtainable.

FIGS. 8A, 8B, 9A, 9B, 9C, 10A, 10B, 11A, 11B, 12A, 12B, 13A and 13B depict still further embodiments of the invention explaining and illustrating particularly advantageous possibilities for providing further decoupled outputs and inputs which are available for structuring complex logic networks, as well as for explaining the possibilities of equipping the inverter transistors at the output by means of Schottky clamping diodes for a higher switching speed.

PREFERRED EMBODIMENTS OF THE INVENTION

Figure 1:
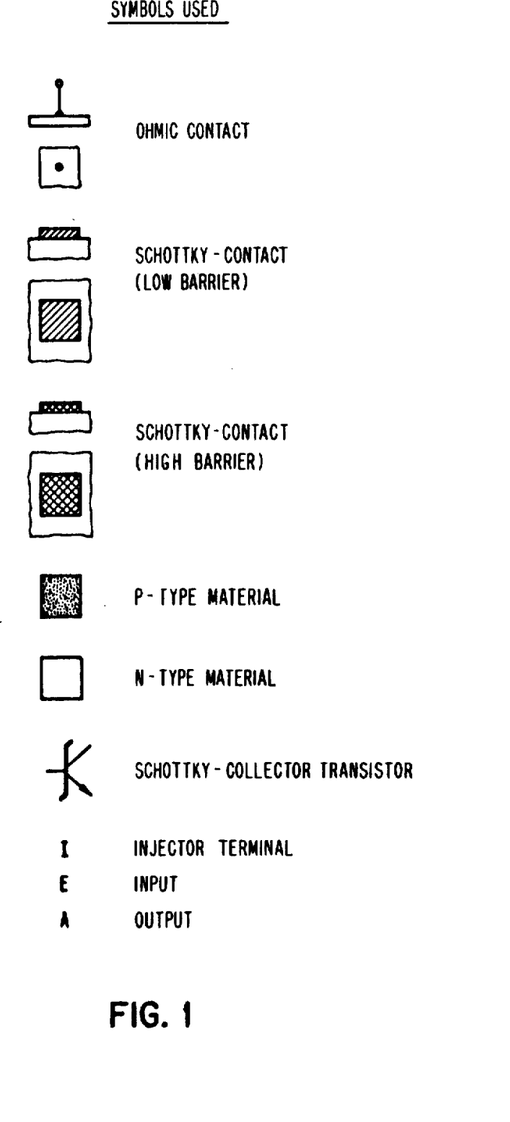
FIG. 1 discloses a listing of the symbols used in the FIGS. 2 through 13 of the drawing.

Before entering into a more detailed discussion of the preferred embodiments of the circuit diagrams thereof represented in the drawings, reference is made to the symbols, which are listed in FIG. 1. These symbols are used in the drawings for the respective contact, material, and connection means or designations, respectively. The symbols used are considered self-explanatory. Hereinafter, when deemed necessary, an additional explanation of the symbols will be given in connection with the description of the specific embodiments. Regarding terminals I, E and A, it is pointed out in advance that the current supply for the primary injectors, i.e. the operation of the injector terminals I, can take place in parallel. Furthermore, an output A can directly address an input E by (direct) DC connection or similar mens, i.e. outputs A are compatible with inputs E.

It is to be appreciated that the plan views, crossectional views, the representation of the mutual arrangement of doped zones, as well as the other dimensions of the preferred embodiments depicted in the drawing are by no means true to scale but that they are intentionally presented in a different scale for the sake of better understanding. Similarly, contacts and interconnections are drawn schematically only.

Figures 2A, 2B:
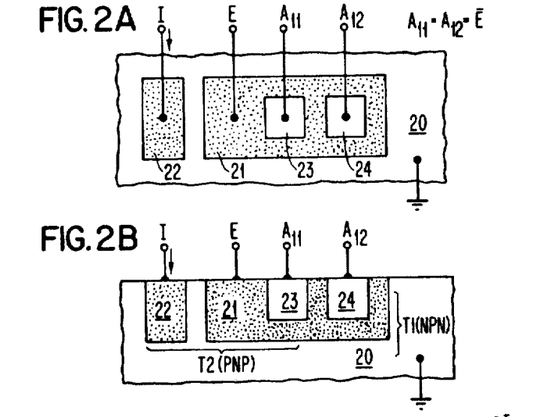
FIG. 2A is a plan view.
FIG. 2B is a cross-sectional view.

FIGS. 2A and 2B respectively show a plan view and an associated cross-sectional view of a known basic I$^2$L structure. The structure as well as the operation of this I$^2$L structure are discussed in detail in the above mentioned literature and patents. Thus only a summation is deemed to be necessary herein. (Reference is expressly made to U.S. Pat. Nos. 3,736,477 and 3,816,758, and to the Publication "Merged Transistor Logic (MTL) - A Low Cost Bipolar Logic Concept" by Horst H. Berger and Siefried K. Weidmann, IEEE Solid-State Circuits, Vol. SC-7, No. 5, October 1972, pages 340 through 346). Such a basic I$^2$L component substantially consists of an inverter transistor T1 which is fed by direct injection of minority carriers. Since for logic systems the availability of, if possible, several decoupled outputs for the same respective logic signals is of increased importance the inverter transistor is a multi-collector transistor. In FIG. 2, this inverter transistor T1 is structured as an inversely operated vertical NPN transistor. A PNP transistor T2 complementary thereto being provided for the minority carrier injection, Transistor T2 is a lateral transistor in the structure of FIGS. 2A and 2B. Transistor T1 and T2, in a manner permitting maximum integration, are merged with each other, using common semiconductor doped regions or zones, respectively. In a common basic semiconductor material 20, e.g., of N-type silicon, which preferably consists of an epitaxially grown semiconductor layer and which serves as emitter zone of inverter transistor T1, two doped regions 21 and 22 spaced from each other and having a conductivity opposite to that of the basic material are provided. The P-doped region 21 is used as base zone of the vertical inverter transistor T1, and simultaneously as collector zone of the lateral (injection) transistor T2. Base zone 21 of T1 shows an ohmic contact via which an input terminal E is provided. Within base zone 21 the given arrangement shows two separate collector zones 23 and 24 which are connected to the corresponding outputs $A_{11}$ and $A_{12}$. P-doped region 22 has an injector terminal I via which a current is externally impressed in the given arrow direction. Doped region 22 fed by an externally applied current will be designated below also a primary injector. From a circuit technology point of view, it represents the emitter zone of the lateral PNP transistor T2 whose base zone, with the emitter zone of inverter transistor T1, is designed in the same semiconductor substrate 20. When corresponding operating voltages are applied this I$^2$L component practically represents an inverter element.

Figure 2C:
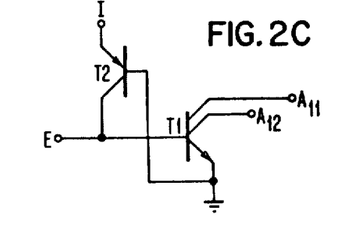
FIG. 2C is an electric circuit diagram representation.
Figure 2D:
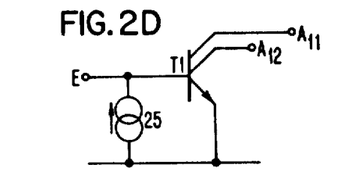
FIG. 2D is a more generalized circuit diagram representation.

The circuit diagram of FIG. 2C is a representation of such an I$^2$L component, without structural features. There the designations for terminals and transistors are correspond with the representation in FIGS. 2A and 2B. FIG. 2D is a still further generalized circuit diagram of the I$^2$L component. This circuit diagram has established itself in the literature. It indicates the current feeding into the base zone of inverter transistor T1 by a current source 25.

Figure 2E:
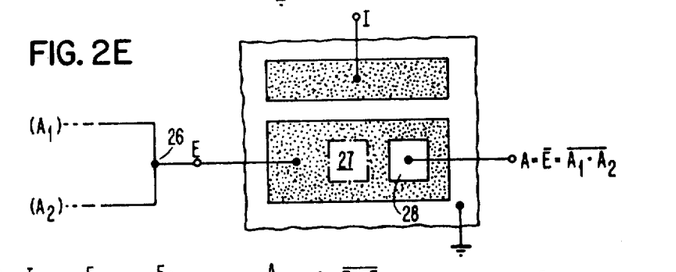
FIG. 2E discloses a basic logic circuit in accordance with the classical I²L concept.

A logic system cannot be built solely of negation elements or inverters, respectively, but with NAND gates as components, a basic logic circuit, in the classical I$^2$L concept, as depicted in FIG. 2E may be used. The fundamental NAND function depicted in FIG. 2E obtained by the direct DC coupling of the two outputs, e.g. $A_1$ and $A_2$, obtained from corresponding MTL structures. The signal obtained at output A represents the NAND function if a so-called positive logic is assumed by definition, or the NOR function complementary thereto if negative logic is assumed by definition. As indicated by the dash-dotted second collector region 27, this resulting output can be repeatedly provided in a decoupled form. The decoupling is achieved in that the transistor shows a considerable current gain $\beta_1$ in inverse operation, i.e. when collector zone 27 or 28 is used as an emitter.

Figure 3A:
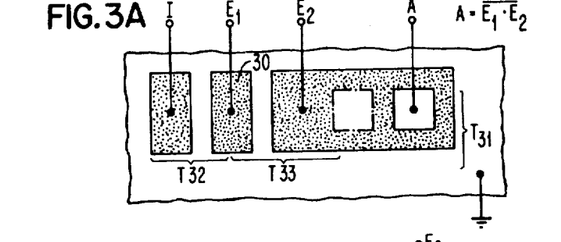
FIGS. 3A and 3B respectively disclose a plan view and a circuit diagram.
Figure 3B:
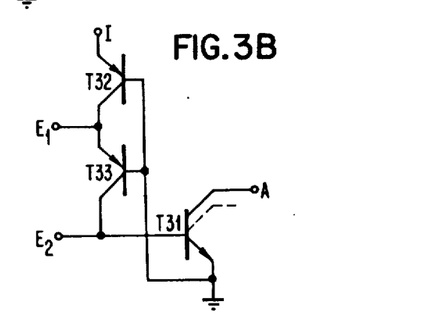

FIGS. 3A and 3B show in a plan view and in a corresponding circuit diagram a first embodiment of the invention utilizing the shown I²L concept. If between the primary injector I and the transistor structure representing the inverter transistor $T_{31}$ another P-type emitter zone 30 is inserted the same (NAND) function as in FIG. 2E can be obtained in a new manner. The P-type emitter zone 30, of FIG. 3A, functions as a secondary injector. Thus, on the basis of the MTL concept, logic combinations by switching the injection current in the PNP structural portion are provided. The function resulting therefrom can be explained in that the injection current from the primary injector I can reach the base zone of the final inverter transistor $T_{31}$ only as a function of the logic input $E_1$ applied to secondary injector 30. It will be noted that the signal of inverter transistor $T_{31}$ at the output A additionally occurs under the condition of a further input signal at its base terminal $E_2$. According to the above discussed prior art, the provision and function of such secondary injectors are known, but the embodiment presented here differs therefrom in that the logic connecting path is systematically continued inside the semiconductor body to the inverter transistor. The otherwise necessary conductive lines on the surface of the semiconductor body are not required. Also the necessity of providing the inverter transistor required in any case for providing one or several decoupled output signals, with at least surface-consuming isolation separating it from the logic path, is obviated. Thus large scale integrated logic structures are advantageously provided.

The arrangement of FIG. 3A can be advantageously used when a number of decoupled collectors and outputs of an (NPN) inverter transistor are required function $E_1$ is available for generating in parallel several functions of the type $$A_1 = \overline{E_1 \cdot E_2}, A_2 = \overline{E_1 \cdot E_3} \text{ and } A_3 = \overline{E_1 \cdot E_4}$$

Figure 3C:
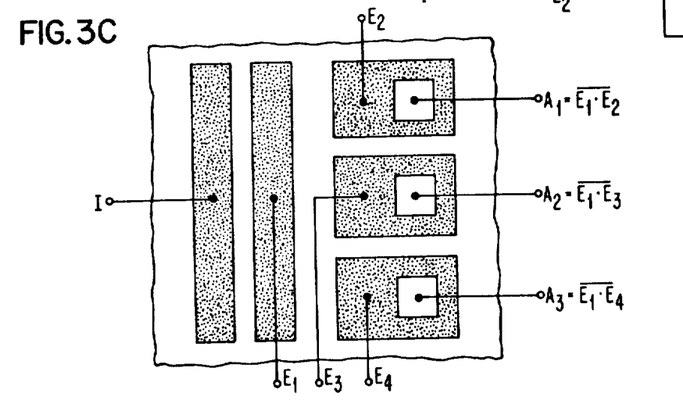
FIG. 3C discloses a plan view which is related to the plan view of FIG. 3A and to the circuit diagram of FIG. 3B.

In that case, an embodiment of the invention according to FIG. 3C can advantageously be used.

Figure 4:
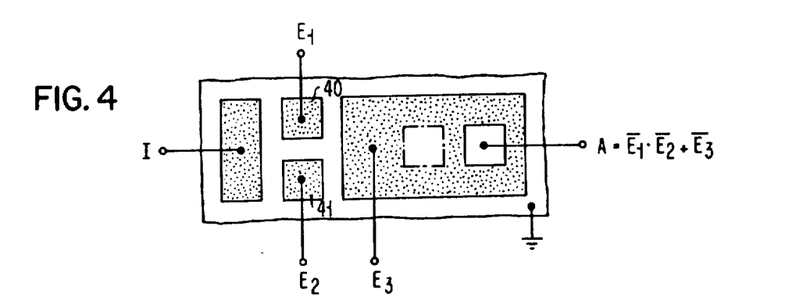
FIG. 4 discloses a plan view of a preferred embodiment of the invention.

A further significant embodiment of the invention, is achieved with parallel secondary injectors 40 and 41 as represented in FIG. 4. Referring to FIG. 4, the logic function $\overline{E_1 \cdot E_2 + E_3}$ is obtained at output A. Although the MTL concept is employed, the logic function $a = \overline{E_1 \cdot E_2 + E_3}$ cannot be directly generated in accordance with prior art. If input 3 is left open, which corresponds to the binary state 1, the function $\overline{E_1 \cdot E_2}$ is obtained at output A, which corresponds to the basic NOR function $\overline{E_1 + E_2}$. It can be shown that with embodiments in accordance with FIGS. 3 and 4, a plurality of combinations with further new logic functions can be established. These possibilities exist with the essential advantages of the I²L concept (utilization of a common (N-type) semiconductor material; low power supply voltage; low capacities with resulting small speed/power product) being maintained, by utilizing the condition-dependent switchability of the injection current.

Figure 5A:
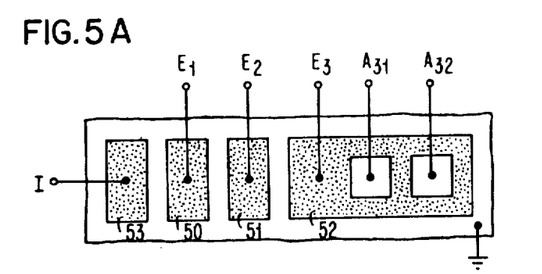
FIGS. 5A, 5B and 5C respectively disclose a plan view, cross-sectional view, and a circuit diagram of a preferred embodiment of the invention.
Figure 5B:
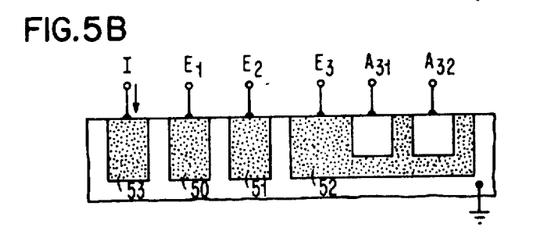
Figure 5C:
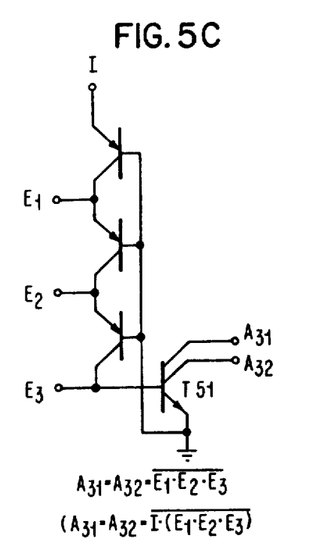

FIGS. 5A (plan view), 5B (cross-section), and 5C (circuit diagram) shown in an embodiment of the invention how the new logic concept can be extended by the serial arrangement of several secondary injectors, cp. 50, 51, and how in consequence a substantial injection logic in accordance with the invention can be achieved. By the arrangement of FIG. 5 an AND function is provided, since base zone 52 of NPN inverter transistor $T_{51}$ at, the output, receives a current from primary injector 53 only when all inputs $E_1$, $E_2$ and $E_3$ show the upper voltage level, or are floating. NPN inverter transistor $T_{51}$ at the output causes an inversion so that the logic function of the overall arrangement in the shown example is the NAND function with respect to inputs $E_1$ to $E_3$. As explained hereinabove, by providing several collector zones within the inverter transistor structure this function ($\overline{E_1 \cdot E_2 \cdot E_3}$) can be several toimes obtained in a decoupled output form.

If considerations advance a step to regard input I of primary injector 53 as a logic input the obtainable logic function can be generalized into $\overline{I \cdot (E_1 \cdot E_2 \cdot E_3)}$, cf. FIG. 5C. This is the most general form, as it also includes as a logical input I the current supply within the logic function. In other words, no strict differentiation is made between current injectors and other injectors with respect to the logic function.

Figure 6:
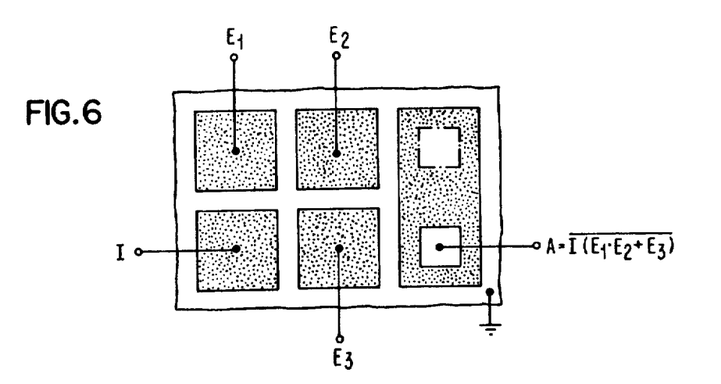
FIG. 6 discloses a plan view of a further preferred embodiment of the invention.

FIG. 6 shows another advantageous embodiment of the invention, where the arrangement is further generalized by a combination with parallel secondary injectors. By means of such series/parallel arrangements of secondary injectors any desired combination with respect to the necessary output function can be obtained, so that a further increase in logic efficiency is accomplished. Regarding the logic function of the embodiment according to FIG. 6, reference is made to the representation in this figure. Further explanation is not deemed necessary in view of the explanation and description given in connection with the earlier embodiments.

Figure 7A:
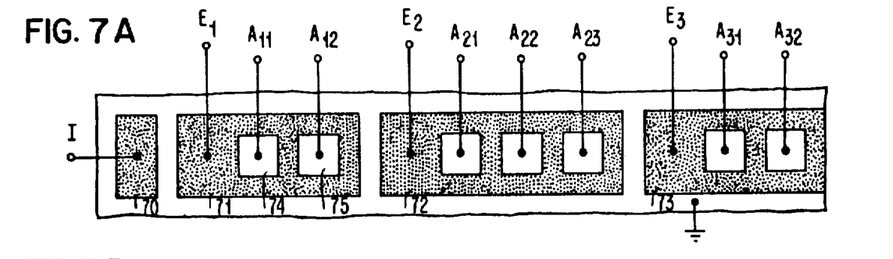
FIGS. 7A, 7B and 7C respectively disclose a plan view, cross-sectional view and a circuit diagram of the primary preferred embodiment of the invention.
Figure 7B:
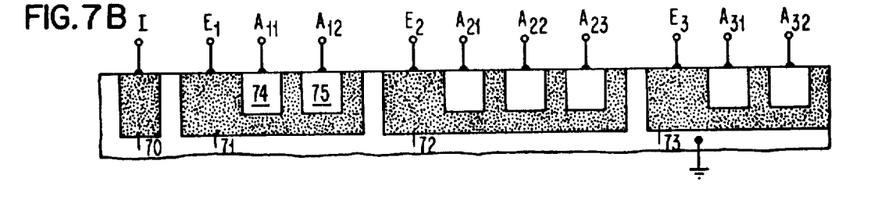
Figure 7C:
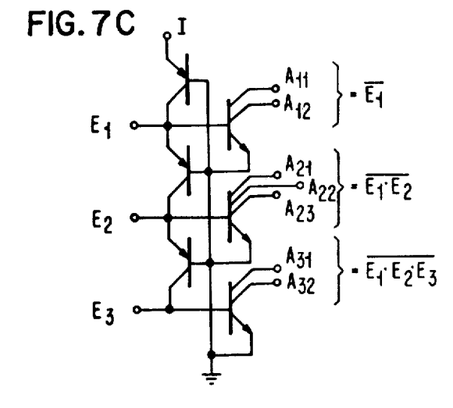

Referring to the integrated design FIGS. 7A and 7B, and the circuit diagram FIG. 7C, a more general form of the logic applications provided with I²L structures in accordance with the invention is depicted. The secondary injectors which are provided in earlier embodiments and which per se represent logic functions have been extended to (NPN) inverter transistors which in turn contain decoupled collector outputs. Also, it should be appreciated that by means of direct connections (dotting) further logic functions can be effected. Consequently, the associated arrangements are characterized in that at least one of the secondary injectors is extended into a transistor structure supplying a decoupled output signal, and at least one additional collector is arranged in this secondary injector. Thus, all part functions, beside the output functions obtainable from such a series arrangement are available in mutliple form for further branching, if required. The injection current from primary injector 70 therefore meets on its course secondary injectors 71, 72, 73 equipped with further condition inputs j $E_1$, $E_2$, $E_3$. Said secondary injectors are in turn each extended (at least partly) into inversely operated transistor structures. The secondary injectors representing base zones collector zones, e.g. 74 and 75, may be provided in multiple form. The (part) functions at the respective outputs $A_{11}$, $A_{12}$, etc. are shown in FIG. 7C. It will be apparent that each of these functions are available directly in a decoupled form. Each of these functions may be provided in multiple form, without any additional conductive line connections, isolation means, or separate output drivers being required. Each signal obtained from an output of one such logic circuit may be directly employed as an input of another such logic circuit. In extension of the specific embodiment of FIG. 7, a general form of the switched injection logic can therefore be characterized as a multicollector inverter transistor structure which is surrounded by several primary and/or secondary injectors. Particularly the secondary injectors in the controllable injection current path are arranged in series and/or in parallel to each other. The secondary injectors are of such a nature that by the provision of one, or several collector zones, they can be extended into inverter transistors.

In FIGS. 8 through 13 various structural embodiments are shown in a plan view, and/or cross-sectional representation, and/or a circuit diagram in accordance with the invention. These structural embodiments provide outputs or inputs adapted in their number as well as in their nature, for increasing the switching speed. It should generally be pointed out in advance that decoupled (collector) outputs can always be achieved in that for the associated inverter transistors a high $\beta_i$ value is provided. Alternatively Schottky decoupling diodes are used in the common semiconductor area (collector zone). In these structural embodiments, the indices V always refer to the considered V-th member of such a logic chain which can easily continue in other directions. The transistor structure of FIG. 8, for example, shows in its bae zone 80 a continuous collector zone 81 on which, two Schottky contacts 82 and 83 provide two decoupled outputs $A_{V1}$ and $A_{V2}$. The output signal is thus decoupled vis Schottky diodes from which the inputs of further part structures can be addressed directly. As indicated by the dast-dotted line, an ohmic collector contact for an output $A_0$ can also be provided. The output $A_0$ is a direct collector connection which may be collector dotted with other such outputs.

Figure 9A:
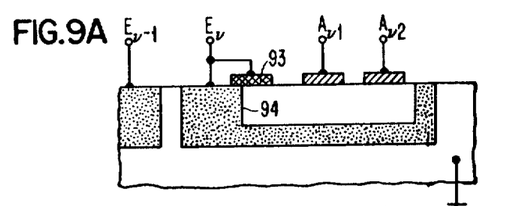
FIGS. 9A, 9B and 9C respectively disclose a cross-sectional view, a plan view and a circuit diagram of a further embodiment of the invention.
Figure 9B:
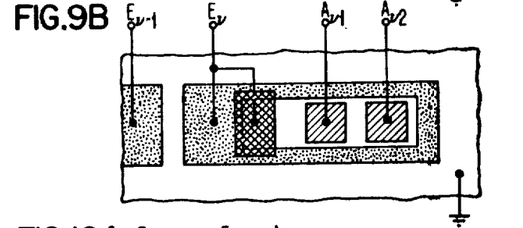
Figure 9C:
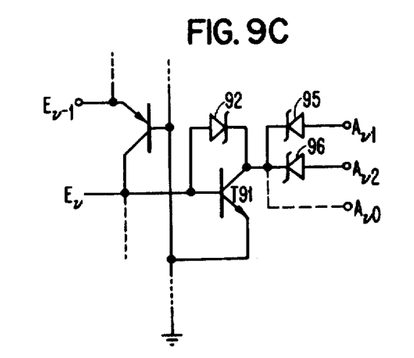

The embodiment of the invention depicted in FIGS. 9A, 9B and 9C is a further extension of the invention in that the NPN transistor $T_{91}$ (FIG. 9C) is provided with a Schottky diode 92 for accelerating the switching characteristics. The use of a Schottky diode shunting the base/collector junction of a transistor to facilitate in-switching thereof, is known to the art. As shown by FIGS. 9A and 9B, this can be advantageously provided in the semiconductor structure in accordance with the invention. This only requires the provision of a Schottky metal contact 93, in the manner depicted in FIGS. 9A and 9B, overlying the surface of the base/collector junction 94. It should be appreciated that the barrier of the Schottky clamping diode 92 is higher than that of the coupling diodes 95 and 96.

Making such Schottky contacts is known per se. It is known that the height of the Schottky barrier at the semiconductor metal junction depends on the respective metal/semiconductor pair that has been chosen. By using different metals (or semiconductor materials) Schottky contacts with different barriers can thus be produced. With regard to the different representation of Schottky contacts with high or low barrier, respectively, reference is made to the representations of FIG. 1.

Figure 10A:
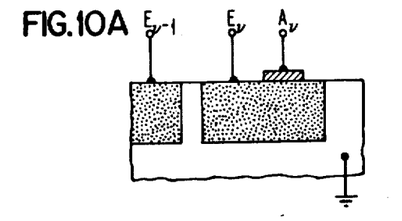
FIGS. 10A and 10B, respectively disclose a cross-sectional view and a circuit diagram of a further significant embodiment of the invention.
Figure 10B:
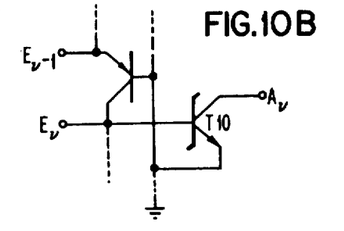

A particularly advantageous embodiment of the invention is shown in FIG. 10. The semiconductor structure shown there does no longer require a collecting doping step for providing an inverter transistor. The inverter transistor is formed by a Schottky collector transistor $T_{10}$ known per se. The saving of a separate doping step thus permits a much simplified manufacturing process, as well as a further increased packing density.

Figure 8A:
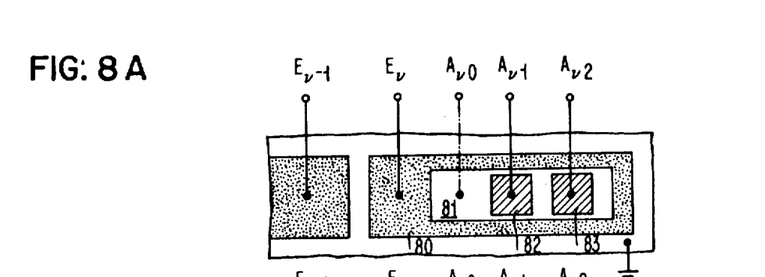
FIGS. 8A and 8B respectively disclose a plan view and a cross-sectional view of an embodiment of the invention.
Figure 8B:
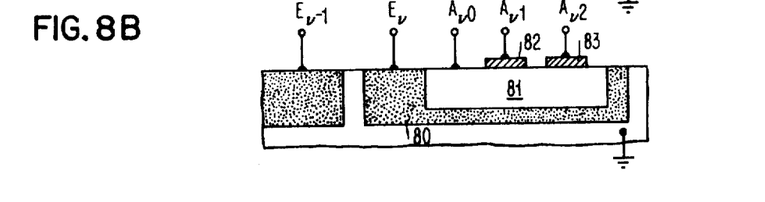
Figure 8C:
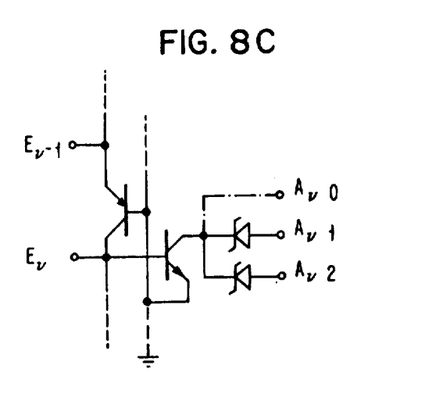
Figure 11A:
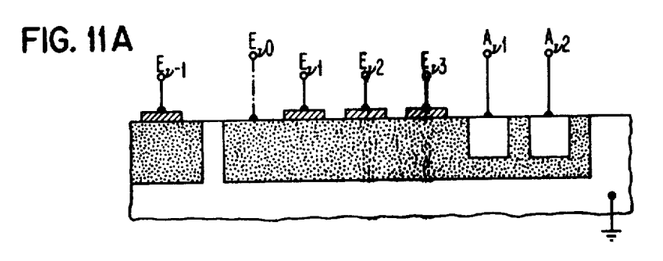
FIGS. 11A and 11B, respectively, disclose a cross-sectional view and a circuit diagram of a further embodiment of the invention.
Figure 11B:
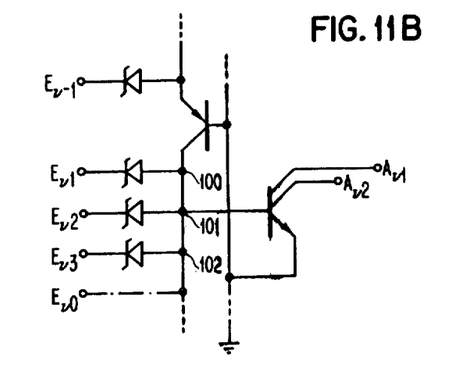

The Schottky decoupling diodes which can be provided exclusively or together with standard collector outputs can be integrated either with the (N-type) collector of the (NPN) inverter transistor, cp. FIGS. 8 and 9, or with the input, i.e. the (P-type) base zone of the complementary (PNP) transistor structure. The latter case is shown in the embodiment of FIG. 11, in a cross-section as well as in a circuit diagram. Apart from the Schottky inputs a further ohmic contact is possible, as indicated by dash-dotted input $E_{v0}$. Due to the direct connection of the Schottky diodes on the P-side at points 100, 101 and 102 logic functions are possible in addition to those of NPN transistor collectors $A_{v1}$, $A_{v2}$.

Figure 12A:
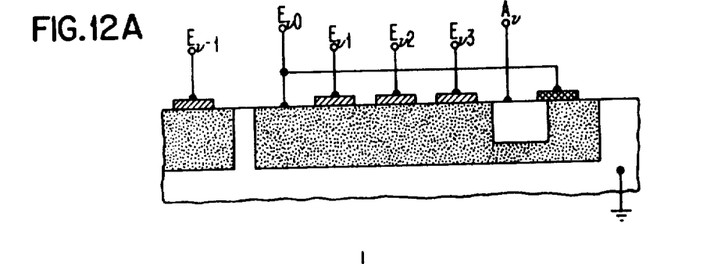
FIGS. 12A and 12B, respectively, disclose a cross-sectional view and a circuit diagram of a further embodiment of the invention.
Figure 12B:
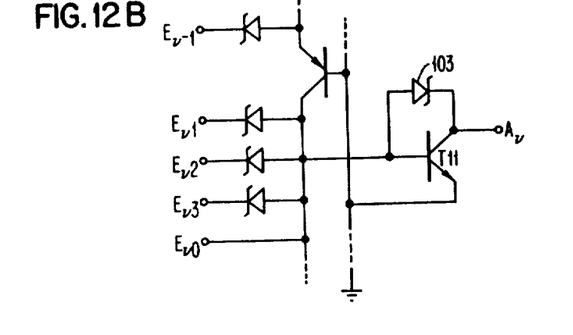

The embodiment of the invention depicted in FIG. 12 differs from that of FIG. 11 in that a Schottky clamping diode 103 is again provided additionally for the output-side inverter transistor $T_{11}$.

Figure 13A:
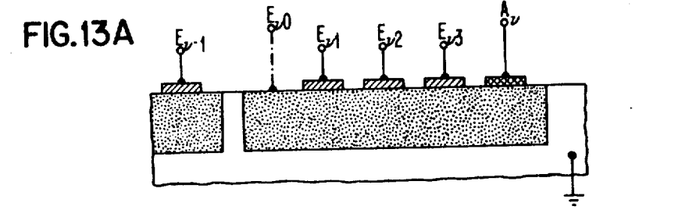
FIGS. 13A and 13B respectively, disclose a cross-sectional view and a circuit diagram of a further embodiment of the invention.
Figure 13B:
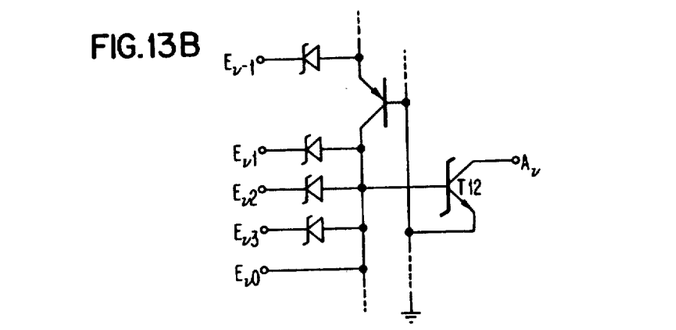

The embodiment of the invention depicted in FIG. 13A is a cross-section, as well as in FIG. 13B in a circuit diagram differs from the embodiment of FIG. 11 in that the inverter transistor is designed as a Schottky collector transistor $T_{12}$. Reference is made in that connection to the different selection of the associated Schottky barriers discussed earlier herein.

As far as in the decribed embodiments of the invention AND-chains (series arrangements) have been shown. It is possible to use in the same manner and by parallel arrangement OR-chains, or combinations of both chains, respectively. Furthermore, the respective shown placing of the collectors, of the ohmic contacts, as well as of the Schottky diodes in the secondary injector region (base zone) is not the only one possible. Collectors for example can be arranged around the respective base contact, or in a row transversely to the direction of the logic chain, instead of in the longitudinal direction in accordance with the depicted embodiments of the invention.

For separating chains from each other, and/or for reducing an injection in predetermined directions "inhibitors" can be inserted. Suitably formed stripes of an insulating material, preferably a semiconductor oxide may be employed as inhibitors. Furthermore, N+ doped stripes or P-stripes connected to ground can be provided for that purpose. A secondary injector having an N-collector can also be used as an inhibitor in that its base is connected to the collector.

It may furthermore be advantageous that chains coming from several primary injectors intersect when such a logic function is desired at the respective location. Such an arrangement can provide the OR-combination.

It should also be noted that structures which according to present-day technology lead to a low $\beta_i$ (inverse current gain factor), as for example a Schottky collector, are advantageously used mainly at the end of a chain, because their secondary injector effect might not be sufficient in a specific case.

Herein the transistor or injector structures have been shown in their lateral or vertical design, respectively. This does not represent a necessary limitation. By using multi-layer structures it is indeed possible to build purely vertical or, on the other side, purely lateral structural arrangements or combinations thereof. Furthermore in the given embodiments N-type or P-type semiconductor regions have been selected, it is equally possible to use associated complementary structures by exchanging the conductivity types with respective operating voltage inversion or adaptation, respectively.

While the invention has been particularly shown and described with reference to the preferred embodiments thereof, it will be understood by those skilled in the art that various changes in form and details may be made therein without departing from the spirit and scope of the invention.

What is claimed is:

1. A monolithically integrated binary logic circuit for receiving first, second and third binary inputs respectively designated as $x$, $y$ and $z$ and providing a first logical binary output of $\bar{x}$, a second logical binary output of $\overline{x \cdot y}$, and a third logical binary output of $\overline{x \cdot y \cdot z}$, said logic circuit comprising:

first, second and third transistors of a first conductivity type, said first, second and third transistors each having an emitter, base and collector;

fourth, fifth and sixth transistors of a second conductivity type, said second conductivity type being opposite to said first conductivity type, said fourth, fifth and sixth transistors each having an emitter, base and collector;

a first input terminal for receiving a first binary input designated as $x$ and directly connected to said collector of said first transistor, said emitter of said second transistor and said base of said fourth transistor;

a second input terminal for receiving a second binary input designated as $y$ and directly connected to said collector of said second transistor, said emitter of said third transistor and said base of said fifth transistor;

a third input terminal for receiving a third binary input designated as $z$ and directly connected to said collector of said third transistor and said base of said sixth transistor;

current source means connected to said emitter of said first transistor;

first connection means connecting in common said base of said first transistor, said base of said second transistor, said base of said third transistor, said emitter of said fourth transistor, said emitter of said fifth transistor, and said emitter of said sixth transistor;

second connection means connecting said first connection means to a source of reference potential;

a first output terminal connected to said collector of said fourth transistor, said first output terminal providing the logical binary output of $\bar{x}$ in response to the binary input $x$ being impressed on said first input terminal;

a second output terminal connected to said collector of said fifth transistor, said second output terminal providing the logical binary output of $\overline{x \cdot y}$ in response to binary inputs of $x$ and $y$ respectively being impressed on said first and second input terminals;

and a third output terminal connected to said collector of said sixth transistor, said third output terminal providing the logical binary output $\overline{x \cdot y \cdot z}$ in response to binary inputs of $x$, $y$ and $z$ respectively being impressed on said first, second and third input terminals.

2. A monolithically integrated binary logic chip fabricated by large scale integration techniques, said chip containing at least first and second monolithically integrated binary logic circuits as recited in claim 1, wherein the first output terminal of said first monolithically integrated binary logic circuit is connected via at least one Schottky diode to the first input terminal of said second monolithically integrated binary logic circuit.

3. A monolithically integrated binary logic circuit as recited in claim 1 wherein a first Schottky Barrier diode is connected between said first output terminal and said collector of said fourth transistor, a second Schottky Barrier diode is connected between said second output terminal and said collector of said fifth transistor, and a third Schottky Barrier diode is connected between said third output terminal and said collector of said sixth transistor.

4. A monolithically integrated binary logic circuit, as recited in claim 1 wherein said fourth transistor has a plurality of collectors and each of said collectors of said fourth transistor provides the logical binary output $\bar{x}$ in response to a binary input of $x$ being impressed on said first input terminal.

5. A monolithically integrated binary logic circuit as recited in claim 1 wherein said fifth transistor has a plurality of collectors and each of said collectors of said fifth transistor provides the logical binary output $\overline{x \cdot y}$ in response to binary inputs of $x$ and $y$ respectively being impressed on said first and second input terminals.

6. A monolithically integrated binary logic circuit as recited in claim 1 wherein said sixth transistor has a plurality of collectors and each of said collectors of said sixth transistor provides the logical binary output $\overline{x \cdot y \cdot z}$ in response to binary inputs of $x$, $y$ and $z$ respectively being impressed on said first, second and third input terminals.

7. A monolithically integrated binary logic circuit as recited in claim 1 wherein said first, second and third transistors are respectively laterally disposed within a monolithic semiconductor structure and said fourth, fifth and sixth transistors are respectively vertically disposed within said monolithic semiconductor structure.

8. A monolithically integrated binary logic circuit as recited in claim 7 wherein said base of said first transistor, said base of said second transistor said base of said third transistor, said emitter of said fourth transistor, said emitter of said fifth transistor, and said emitter of said sixth transistor are respectively formed in common by a first portion of said monolithic semiconductor structure of a first conductivity type.

9. A monolithically integrated binary logic circuit as recited in claim 8 wherein said collector of said first transistor, said base of said fourth transistor and said emitter of said second transistor are respectively formed in common by a second portion of said monolithic semiconductor structure of a second conductivity type.

10. A monolithically integrated binary logic circuit as recited in claim 9 wherein said collector of said second transistor, said base of said fifth transistor and said emitter of said third transistor are respectively formed in common by a third portion of said monolithic semiconductor structure of said second conductivity type.

11. A monolithically integrated binary logic circuit as recited in claim 10 wherein said collector of said third transistor and said base of said sixth transistor are respectively formed in common by a fourth portion of said monolithic semiconductor structure of said second conductivity type.

12. A monolithically integrated binary logic circuit as recited in claim 1 wherein said first input terminal, said collector of said first transistor, said base of said fourth transistor and said emitter of said second transistor are respectively formed in common by a first integral portion of the semiconductor material of which said monolithically integrated binary logic circuit is fabricated.

13. A monolithically integrated binary logic circuit as recited in claim 1 wherein said second input terminal, said collector of said second transistor, said base of said fifth transistor, and said emitter of said third transistor are respectively formed in common by a second integral portion of the semiconductor material of which said monolithically integrated binary logic circuit is fabricated.

14. A monolithically integrated binary logic circuit as recited in claim 1 wherein said third input terminal, said collector of said third transistor and said base of said sixth transistor are respectively formed in common by a third integral portion of the semiconductor material of which said monolithically integrated binary logic circuit is fabricated.

15. A monolithically integrated binary logic circuit as recited in claim 1 wherein said first connection means, said transistor, said base of said third transistor said emitter of said fourth transistor, said emitter of said fifth transistor, and said emitter of said sixth transistor are respectively formed in common by a fourth integral portion of the semiconductor material of which said monolithically integrated binary logic circuit is fabricated.

16. A monolithically integrated binary logic circuit as recited in claim 1 wherein said current source means connected to said emitter of said first transistor impresses a binary input designated as q on said emitter of said first transistor, whereby said binary logic circuit, as recited in claim 110, provides the logical binary output $\overline{x \cdot q}$ at said first output terminal in response to the binary inputs of x and q respectively being impressed on said first input terminal and said emitter of said first transistor, provides the logical binary output $\overline{x \cdot y \cdot q}$ at said second output terminal in response to the binary inputs of x, y and q respectively being impressed on said first input terminal, said second input terminal and said emitter of said first transistor, and provides the logical binary output $\overline{x \cdot y \cdot z \cdot q}$ at said third output terminal in response to the binary inputs x, y, z and q respectively being impressed on said first input terminal, said second input terminal, said third input terminal and said emitter of said first transistor.

17. A monolithically integrated binary logic circuit as recited in claim 1 wherein:
said base of said first transistor, said base of said second transistor, said base of said third transistor, said emitter of said fourth transistor, said emitter of said fifth transistor and said emitter of said sixth transistor are respectively formed in common by a first portion of the semiconductor material of which said monolithic integrated binary logic circuit is fabricated;
said collector of said first transistor, said base of said fourth transistor and said emitter of said second transistor are respectively formed in common by a second portion of the semiconductor material of which said monolithic integrated binary logic circuit is fabricated;
said collector of said second transistor, said base of said fifth transistor and said emitter of said third transistor are respectively formed in common by a third portion of the semiconductor material of which said monolithic integrated binary logic circuit is fabricated;
and said collector of said third transistor and said base of said sixth transistor are respectively formed in common by a fourth portion of the semiconductor material of which said monolithic integrated binary logic circuit is fabricated.

18. An integrated binary logic circuit for providing a first binary logical output of $\overline{x}$, a second binary logical output of $\overline{x \cdot y}$, and a third binary logical output of $\overline{x \cdot y \cdot z}$ of first, second and third binary inputs respectively designated as x, y and z, said integrated binary logic circuit being contained on a monolithic chip of semiconductor material of a first conductivity type having at least one planar surface, said integrated binary logic circuit comprising:
first, second, third and fourth discrete regions respectively of a second conductivity type lying on and extending into said planar surface of said monolithic chip, said first, second, third and fourth discrete regions being spaced apart one from another in the order recited on said planar surface;
a fifth discrete region of said first conductivity type lying on and extending into said planar surface, said fifth discrete region being contained within and encompassed by said second discrete region;
a sixth discrete region of said first conductivity type lying on and extending into said planar surface, said sixth discrete region being contained within and encompassed by said third discrete region;
a seventh discrete region of said first conductivity type lying on and extending into said planar surface, said seventh discrete region being contained within and encompassed by said third discrete region;
first means for impressing an input current on said first discrete region;
second means for impressing the binary input x on said second discrete region;
third means for impressing the binary input y on said third discrete region;
fourth means for impressing the binary input z on said fourth discrete region;
fifth means for impressing a reference potential on said monolithic chip of semiconductor material of said first conductivity type;
first output means electrically contacting said fifth discrete region; second output means electrically contacting said sixth region; and third output means electrically contacting said seventh discrete region,
whereby the logical binary outputs $\overline{x}$, $\overline{x \cdot y}$ and $\overline{x \cdot y \cdot z}$ are respectively manifested by said first output means, said second output means and said third output means in response to said second means, said third means and said fourth means respectively impressing said binary inputs x, y and z on said second discrete region, said third discrete region and said fourth discrete region, respectively.

19. An integrated binary logic circuit, as recited in claim 18, where said first, second and third output means, respectively include at least one Schottky Barrier diode.

20. An integrated binary logic circuit, as recited in claim 18, where said second, third and fourth means respectively include at least one Schottky Barrier diode.

21. An integrated binary logic circuit, as recited in claim 18 where said first, second and third output means, respectively include at least one Schottky metal contact forming a Schottky Barrier diode junction with the discrete region with which said output means is in electrical contact.

22. An integrated binary logic circuit, as recited in claim 18, where said second, third and fourth means respectively include at least one Schottky metal contact forming a Schottky Barrier diode junction with the discrete region with which said second, third and fourth means is associated.

23. An integrated binary logic circuit, as recited in claim 18, wherein an eighth discrete region of said first conductivity type is provided lying on and extending into said planar surface, said eighth discrete region being contained within and encompassed by said second discrete region, a Schottky metal contact forming a Schottky Barrier junction with said eighth discrete region.

24. An integrated binary logic circuit, as recited in claim 18 wherein said second output means electrically contacting said sixth discrete region comprises at least one discrete ohmic contact with said sixth region and at least one discrete Schottky metal contact with said sixth region.

25. An integrated binary logic circuit as recited in claim 18, wherein said first conductivity type is N type semiconductor material and said second conductivity type is P type semiconductor material, and where said fourth means includes a Schottky metal contact overlying said pn junction existing between said fourth discrete region and said seventh discrete region.

* * * * *